United States Patent
Perzlmaier et al.

(10) Patent No.: US 10,290,784 B2
(45) Date of Patent: May 14, 2019

(54) OPTOELECTRONIC SEMICONDUCTOR COMPONENT, OPTOELECTRONIC ARRANGEMENT AND METHOD FOR PRODUCING AN OPTOELECTRONIC SEMICONDUCTOR COMPONENT

(71) Applicant: OSRAM Opto Semiconductors GmbH, Regensburg (DE)

(72) Inventors: Korbinian Perzlmaier, Regensburg (DE); Stefanie Rammelsberger, Zeitlarn (DE); Anna Kasprzak-Zablocka, Donaustauf (DE); Julian Ikonomov, Neurtaubling (DE); Christian Leirer, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 2 days.

(21) Appl. No.: 15/574,809

(22) PCT Filed: May 12, 2016

(86) PCT No.: PCT/EP2016/060734
§ 371 (c)(1),
(2) Date: Nov. 16, 2017

(87) PCT Pub. No.: WO2016/184781
PCT Pub. Date: Nov. 24, 2016

(65) Prior Publication Data
US 2018/0145235 A1 May 24, 2018

(30) Foreign Application Priority Data
May 21, 2015 (DE) .................. 10 2015 108 056

(51) Int. Cl.
*H01L 33/00* (2010.01)
*H01L 33/62* (2010.01)
(Continued)

(52) U.S. Cl.
CPC .............. *H01L 33/62* (2013.01); *H01L 24/29* (2013.01); *H01L 27/153* (2013.01);
(Continued)

(58) Field of Classification Search
CPC .. H01L 25/042; H01L 25/167; H01L 25/0753
See application file for complete search history.

(56) References Cited

U.S. PATENT DOCUMENTS 7,791,101 B2 * 9/2010 Bergmann .......... H01L 33/0079
257/103
8,933,473 B1 1/2015 Dubin
(Continued)

FOREIGN PATENT DOCUMENTS

DE  10 2009 006 177 A1  6/2010
DE     102010034665 A1  2/2012
(Continued)

*Primary Examiner* — Kevin M Picardat
(74) *Attorney, Agent, or Firm* — McDermott Will & Emery LLP (57) ABSTRACT

An optoelectronic semiconductor component comprises an optoelectronic semiconductor chip (C1) having an electrically conductive substrate (T), an active part (AT) containing epitaxially grown layers, and an intermediate layer (ZS) which is arranged between the substrate (T) and the active part (AT) and contains a solder material. The optoelectronic semiconductor component further comprises an electrical connection point, which at least partially covers an underside of the substrate (T), wherein the electrical connection point comprises a first contact layer (KS1) on a side facing the substrate (T), and the first contact layer (KS1) contains aluminium or consists of aluminium.

17 Claims, 2 Drawing Sheets

(51) Int. Cl.
H01L 23/00 (2006.01)
H01L 33/48 (2010.01)
H01L 33/60 (2010.01)
H01L 27/15 (2006.01)
H01L 31/02 (2006.01)
H01L 31/0203 (2014.01)
H01L 31/0232 (2014.01)
H01L 31/18 (2006.01)
H01L 33/40 (2010.01)

(52) U.S. Cl.
CPC .... *H01L 31/0203* (2013.01); *H01L 31/02005* (2013.01); *H01L 31/02327* (2013.01); *H01L 31/186* (2013.01); *H01L 33/0095* (2013.01); *H01L 33/486* (2013.01); *H01L 33/60* (2013.01); *H01L 33/405* (2013.01); *H01L 2933/0066* (2013.01)

(56) References Cited

U.S. PATENT DOCUMENTS

| | | | |
|---|---|---|---|
| 9,147,798 B2 * | 9/2015 | Akaike | H01L 33/0079 |
| 2008/0237823 A1 | 10/2008 | Martin | |
| 2010/0065870 A1 | 3/2010 | Arai et al. | |
| 2011/0012164 A1 | 1/2011 | Kim | |
| 2011/0108865 A1 | 5/2011 | Aldaz et al. | |
| 2012/0319220 A1 | 12/2012 | Noda et al. | |
| 2013/0032845 A1 * | 2/2013 | Chuang | H01L 33/0079 257/99 |
| 2014/0048680 A1 * | 2/2014 | Wicke | H01L 25/167 250/205 |
| 2015/0115290 A1 * | 4/2015 | Guenard | H01L 27/142 257/79 |

FOREIGN PATENT DOCUMENTS

| | | |
|---|---|---|
| DE | 102012215524 A1 | 3/2014 |
| DE | 102012217533 A1 | 3/2014 |
| DE | 102013212247 A1 | 12/2014 |
| GB | 823559 A | 11/1959 |
| WO | 2014097644 A1 | 6/2014 |
| WO | 2015062867 A1 | 5/2015 |
| WO | 2016120047 A1 | 8/2016 |

* cited by examiner

OPTOELECTRONIC SEMICONDUCTOR COMPONENT, OPTOELECTRONIC ARRANGEMENT AND METHOD FOR PRODUCING AN OPTOELECTRONIC SEMICONDUCTOR COMPONENT

An object to be achieved consists in providing an improved concept for an optoelectronic semiconductor component, which allows improved adhesion of a rear-side contact together with good electrical contacting.

An optoelectronic semiconductor component is provided. The optoelectronic semiconductor component can comprise e.g. a radiation-emitting and/or a radiation-detecting semiconductor component. For example, the optoelectronic semiconductor component can comprise a light-emitting diode and/or a photodiode.

According to at least one embodiment of the optoelectronic semiconductor component, the optoelectronic semiconductor component comprises at least one optoelectronic semiconductor chip. The optoelectronic semiconductor chip is e.g. an LED chip or a photodiode chip. In other words, the optoelectronic semiconductor chip is provided for generating or detecting electromagnetic radiation, e.g. light, during operation.

According to at least one embodiment of the optoelectronic semiconductor component, the optoelectronic semiconductor chip comprises an electrically conductive carrier. The carrier is e.g. a carrier body other than a growth substrate. The carrier can be formed using e.g. a semiconductor material, preferably a doped semiconductor material, or a metal. Alternatively, the carrier can also be a growth substrate.

According to at least one embodiment of the optoelectronic semiconductor component, the optoelectronic semiconductor chip comprises an active part, which contains epitaxially grown layers. The epitaxially grown layers can comprise at least one active zone, in which the electromagnetic radiation to be generated is generated or the electromagnetic radiation to be detected is detected during operation of the optoelectronic semiconductor chip.

Between the carrier and the active part, a reflective layer can additionally be arranged, which is formed using a reflective material such as e.g. aluminum or silver.

According to at least one embodiment of the optoelectronic semiconductor component, the carrier is connected to the active part by means of a wafer bonding method. In the wafer bonding method, a first wafer, which contains the carrier during a phase of the production method of the optoelectronic semiconductor component, is mechanically and electrically connected to a second wafer, which contains the active part during a phase of the production method of the optoelectronic semiconductor component. The wafer bonding method here is e.g. an eutectic bonding method by means of a eutectic alloy, a method of bonding by means of isothermal solidification or an adhesive bonding method by means of an adhesive, in particular an electrically conductive adhesive.

The wafer bonding method can also be a direct bonding method, in which the first wafer is pressed on to the second wafer at an elevated process temperature, wherein hydrogen bridge bonds and/or van der Waals bonds can be formed between the first and second wafers, leading to the mechanical and electrical connection.

According to at least one embodiment of the optoelectronic semiconductor component, the optoelectronic semiconductor chip comprises an intermediate layer, which is arranged between the carrier and the active part and contains a solder material. The purpose of this solder material is e.g. an electrical contacting of the carrier to the active part. Furthermore, the purpose of the solder material is e.g. a mechanical connection of the carrier to the active part.

The solder material can correspond e.g. to the eutectic alloy if the carrier is connected to the active part by means of a eutectic bonding method. If the carrier is connected to the active part by a method of bonding by means of isothermal solidification, the solder material can correspond e.g. to the alloy used for this purpose. The solder material can be formed using e.g. a metal or a metal alloy. In particular, the solder material can contain or consist of a gold-tin alloy or a nickel-tin alloy. Alternatively or in addition, the solder material can contain or consist of indium or an indium alloy.

Alternatively, the solder material can be replaced e.g. by the adhesive if the carrier is connected to the active part by means of an adhesive bonding method.

According to at least one embodiment of the optoelectronic semiconductor component, the optoelectronic semiconductor component comprises an electrical connection point, which at least partly covers the underside of the carrier. The electrical connection point is located on an external side of the optoelectronic semiconductor component and can thus be accessed and bonded externally. The electrical connection point is formed using an electrically conductive material and is electrically connected to an n-side or a p-side of the optoelectronic semiconductor chip. During operation of the optoelectronic semiconductor chip, this can then be bonded via the electrical connection point on the n- or p-side.

"At least partly covered" means here and below that the coverage can also be complete.

According to at least one embodiment of the optoelectronic semiconductor component, the electrical connection point comprises a first contact layer on a side facing towards the carrier. The first contact layer in this case borders the carrier. In particular, the first contact layer can border the carrier directly, so that no further layer is located between the carrier and the first contact layer. The first contact layer is selected such that it adheres particularly well to the optoelectronic semiconductor chip. Furthermore, it is selected such that it remains chemically and mechanically stable even at elevated temperatures, such as those occurring e.g. during a soldering process, so that no liquefaction of the first contact layer takes place and no solids diffusion processes of material from the first contact layer into the optoelectronic semiconductor chip take place, or they take place only within the limits of production tolerance.

The first contact layer here can partly or completely cover the underside of the carrier. For example, the first contact layer can cover at least 80%, for example at least 95%, of the area of the underside of the carrier.

The first contact layer can furthermore be formed to reflect electromagnetic radiation to be generated or detected in the optoelectronic semiconductor chip, so that the optical efficiency of the optoelectronic semiconductor component can also be increased as a result of the first contact layer.

According to at least one embodiment of the optoelectronic semiconductor component, the first contact layer contains aluminum or the first contact layer consists of aluminum. Preferably, the contact layer is free from platinum and/or gold. The use of aluminum has proved particularly advantageous e.g. in terms of adhesion of the contact layer on the carrier. At the same time, the use of aluminum permits a good rear ohmic electrical contact of the optoelectronic semiconductor chip.

According to at least one embodiment of the optoelectronic semiconductor component, the optoelectronic semiconductor component comprises an optoelectronic semiconductor chip with an electrically conductive carrier, an active part, which contains epitaxially grown layers, and an intermediate layer, which is arranged between the carrier and the active part and which contains a solder material. The optoelectronic semiconductor component furthermore comprises an electrical connection point, which at least partly covers the underside of the carrier, wherein the electrical connection point comprises a first contact layer on a side facing towards the carrier and the first contact layer contains or consists of aluminum.

According to at least one embodiment of the optoelectronic semiconductor component, the optoelectronic semiconductor component comprises a molded body, which comprises or is formed using an electrically insulating material and which at least partly surrounds the optoelectronic semiconductor chip laterally.

In particular, it is possible but not necessary in this case that the optoelectronic semiconductor component is a so-called "semiconductor chip in a frame" component. A component of this type is described, in a different context, e.g. in the document DE 10 2012 215 524 Al, the relevant disclosure content of which is incorporated herein by reference. In particular a "semiconductor chip in a frame" component comprises a molded body, which can be formed using e.g. a silicone and/or epoxy resin.

The electrical connection point in this case at least partly covers the underside of the molded body and the first contact layer borders the underside of the molded body; in particular, the first contact layer directly borders the underside of the molded body.

The optoelectronic semiconductor chip is e.g. completely surrounded laterally by the molded body. In other words, the optoelectronic semiconductor chip can indirectly or directly border the molded body in a lateral direction. The lateral directions here are those directions running parallel to a main extension plane of the optoelectronic semiconductor component. The lateral directions run perpendicular to a vertical direction, the vertical direction running e.g. parallel or substantially parallel to the stack direction of the layers of the electrical connection point.

In particular, it is possible that the electrical connection point completely covers the underside of the molded body. In this case, heat dissipation via the electrical connection point is particularly good and adhesion between the molded body and the electrical connection point is particularly robust. In addition, the electrical connection point in this case also represents a particularly good adhesive for connecting molded body and semiconductor chip. In other words, the electrical connection point, which extends without interruption both on the underside of the semiconductor chip and on the underside of the molded body, can impede or prevent a detachment of the molded body from the semiconductor chip.

The molded body can comprise a matrix material, which is formed using a plastic such as silicone, epoxy or a silicone-epoxy hybrid material. Reflective and/or absorbing and/or scattering particles can be introduced into the matrix material, which reflect, absorb or scatter occurring electromagnetic radiation, in particular light. In this way, the molded body can be formed to be colored and/or reflective and/or absorbing. Alternatively or in addition, particles which contribute towards reducing the coefficient of thermal expansion of the molded body can be introduced into the matrix material. In particular, particles composed of silicon dioxide can be used for this purpose.

The molded body in this case can be flush or substantially flush with the optoelectronic semiconductor chip at least on the underside of the optoelectronic semiconductor chip facing towards the electrical connection point. Furthermore, it is possible that the optoelectronic semiconductor chip and the molded body are flush or substantially flush with one another on the top side facing away from the underside. Substantially flush here and below means that the optoelectronic semiconductor chip projects beyond the molded body or the molded body projects beyond the optoelectronic semiconductor chip only by a height corresponding to no more than 15% of the thickness of the optoelectronic semiconductor chip in a vertical direction.

The electrical connection point and the first contact layer can extend in lateral directions from the optoelectronic semiconductor chip to the molded body, at least in some areas, so that they cover the molded body on the underside thereof at least in some areas. It is possible in this case that the electrical connection point and the first contact layer extend without interruption from a region in which they cover the optoelectronic semiconductor chip to a region in which they cover the molded body. In the region of the optoelectronic semiconductor chip, the electrical connection point and the first contact layer are mechanically and electrically connected to the optoelectronic semiconductor chip, and in the region of the molded body the electrical connection point and the first contact layer are mechanically connected to the molded body.

In particular, an electrical connection point and/or a first contact layer, which is produced by a means of a PVD method, can extend into regions in which the molded body is located. In this way, the electrical connection point and the first contact layer can be configured to have a particularly large area, allowing a more reliable connection of the electrical connection point and the first contact layer to the remaining components of the optoelectronic semiconductor component on the one hand and to the target location to which the optoelectronic semiconductor component is affixed and connected on the other hand. Furthermore, a configuration of the electrical connection point and the first contact layer such that the molded body is also partly covered by them can contribute to improved heat dissipation during operation of the optoelectronic semiconductor component.

In particular, the first contact layer of the electrical connection point is selected here such that it also exhibits particularly good adhesion to the material of the molded body. In this case, the use of aluminum in the first contact layer, as described, proves particularly suitable for achieving good adhesion to the molded body. This may be explained e.g. by a high reactivity of aluminum with materials comprised by the molded body, e.g. plastics materials, epoxies, fillers, silicon dioxide-containing fillers, filled epoxies, other heterogeneous surfaces or other materials. The high reactivity may be explained e.g. by a high oxidizability of aluminum.

Because of an improved adhesion of the first contact layer to the molded body which is achieved in this way, it is possible, during production of the optoelectronic semiconductor component, for example to omit an additional photo level for the selective contacting of only the underside of the carrier and a further metallizing for contacting the underside of the molded body. It is also possible for example to omit a separate adhesive layer between the first contact layer and the carrier, the production of which would require e.g. an additional lithographic process.

According to at least one embodiment of the optoelectronic semiconductor component, the first contact layer is partly in direct contact with the carrier and/or the molded body. As a result of the direct contact of the first contact layer with the carrier and/or the molded body, the mechanical adhesion between the electrical connection point and the remaining components of the optoelectronic semiconductor component is increased.

In particular, it is possible that the first contact layer is in direct contact both with the optoelectronic semiconductor chip and with the molded body, such that the first contact layer directly borders both components and extends in lateral directions from the optoelectronic semiconductor chip to the molded body. It is particularly advantageous in this case if the molded body and the optoelectronic semiconductor chip are flush or substantially flush with one another on the underside of the optoelectronic semiconductor chip which faces towards the electrical connection point.

According to at least one embodiment of the optoelectronic semiconductor component, the carrier contains silicon or germanium or consists of silicon or germanium. In such embodiments, the use of a first contact layer containing or consisting of aluminum is particularly advantageous.

On the one hand, aluminum forms a good ohmic electrical contact on silicon and on germanium. Furthermore, aluminum does not form any metallurgical phases with silicon or germanium, in contrast to e.g. platinum with silicon or germanium. This leads to low reactivity and therefore to high stability of an interface between the carrier and the first contact layer. Furthermore, aluminum forms a particularly good ohmic contact on silicon, for example on relatively highly doped, in particular p-doped, silicon. Under certain process conditions, for example, this can bring advantages over a contact layer which contains platinum or is formed using platinum.

In addition, a solution of silicon or germanium in aluminum occurs only at temperatures in the order of magnitude of ~500° C. Such a solution of silicon or germanium in aluminum can cause hollow regions in the material of the carrier, in which metallic aluminum can subsequently accumulate (so-called spiking). If this accumulated aluminum penetrates a p-n junction of the optoelectronic semiconductor chip, this leads to a short circuit of the p-n junction. Optoelectronic semiconductor components are not generally exposed to such high temperatures during their production and further processing and use, particularly if the optoelectronic semiconductor component is a "semiconductor chip in a frame" component.

Furthermore, the optoelectronic semiconductor chip and/or the intermediate layer can comprise an intermediate barrier layer, which is arranged between the carrier and the active part and can, for example, prevent penetration of accumulated aluminum into the active part, in particular into the p-n junction, even in the event of spiking occurring. The intermediate barrier layer can be formed e.g. by a solder barrier layer, which is intended to prevent components of the solder material of the intermediate layer from being able to penetrate into the active part.

In alternative embodiments, the carrier consists of a semiconductor material other than silicon or germanium, e.g. a III/V semiconductor material such as gallium arsenide or gallium nitride, a II/VI semiconductor material or silicon carbide.

According to at least one embodiment of the optoelectronic semiconductor component, the carrier has a thickness, in particular a thickness in the vertical direction, of at least 50 µm.

In such embodiments, the probability of the penetration of accumulated aluminum into the active part if spiking occurs is further reduced by the relatively high thickness of the carrier of at least 50 µm.

According to at least one embodiment of the optoelectronic semiconductor component, the first contact layer has a thickness, in particular a thickness in the vertical direction, of between 20 nm and 5 µm.

According to at least one embodiment of the optoelectronic semiconductor component, the first contact layer has a thickness, in particular a thickness in the vertical direction, in a range of 100 nm to 200 nm.

According to at least one embodiment of the optoelectronic semiconductor component, the first contact layer has a thickness, in particular a thickness in the vertical direction, of at least 450 nm.

In these embodiments, an increased lateral current conductivity of the first contact layer can be achieved. This can be advantageous particularly in embodiments in which the first contact layer is used for an internal rewiring in the optoelectronic semiconductor component. A rewiring of this type can be implemented for example between various levels in a "semiconductor chip in a frame" component. The rewiring can also be used for contacting the optoelectronic semiconductor chip with contacts of the optoelectronic semiconductor component. In this case, the contacts can be arranged with a lateral displacement in relation to the optoelectronic semiconductor chip and can be used for an external contacting of the optoelectronic semiconductor component.

According to at least one embodiment of the optoelectronic semiconductor component, the first contact layer has a thickness, in particular a thickness in the vertical direction, of between 450 nm and 5 µm, in particular between 450 nm and 1 µm.

According to at least one embodiment of the optoelectronic semiconductor component, the first contact layer contains an aluminum alloy. In particular, the first contact layer can contain silicon. For example, silicon-containing aluminum alloys with a silicon content of 0.1% to 50%, preferably of 1% to 20%, have proved suitable here. Alternatively, aluminum-silicon alloys with a different silicon content can also be used. The first contact layer can contain e.g. copper in addition to or as an alternative to the silicon. For example, copper-containing aluminum alloys with a copper content of 0.5% to 15%, preferably of 0.5% to 8%, have proved suitable here.

A silicon-containing aluminum alloy is particularly advantageous for cases where the carrier of the semiconductor chip is formed using germanium or silicon. Surprisingly, it has been found that a contact layer which is formed using a silicon-containing aluminum alloy adheres particularly well to such carriers.

According to at least one embodiment of the optoelectronic semiconductor component, the optoelectronic semiconductor component comprises a first further semiconductor chip.

The first further semiconductor chip in this case can be in the form of a further optoelectronic semiconductor chip. For example, the optoelectronic semiconductor chip and the further optoelectronic semiconductor chip can generate and/or detect electromagnetic radiation in the same or in a different range of the spectrum during operation. Alternatively, the first further semiconductor chip can be in the form of a through-connection or a protection diode.

According to at least one embodiment of the optoelectronic semiconductor component, the molded body at least partly surrounds the first further semiconductor chip laterally. In other words, in a lateral direction, the first further semiconductor chip can border the molded body indirectly or directly.

According to at least one embodiment of the optoelectronic semiconductor component, the optoelectronic semiconductor component comprises a further electrical connection point, which at least partly covers the underside of the first further semiconductor chip and at least partly covers the underside of the molded body. The further electrical connection point is located on an external side of the optoelectronic semiconductor component and can thus be accessed and contacted externally. The further electrical connection point is formed using an electrically conductive material and is electrically connected to the first further semiconductor chip.

The molded body in this case can be flush or substantially flush with the first further semiconductor chip at least on the underside of the first further semiconductor chip facing towards the further electrical connection point. Furthermore, it is possible that the first further semiconductor chip and the molded body are flush or substantially flush with one another on the top side facing away from the underside.

The electrical connection point and the further electrical connection point are arranged e.g. at a distance from one another on the underside of the optoelectronic semiconductor component in lateral directions, so that the optoelectronic semiconductor component can be surface mounted via these two electrical connection points.

According to at least one embodiment of the optoelectronic semiconductor component, the further electrical connection point comprises a second contact layer on a side facing towards the first further semiconductor chip and the molded body.

The further electrical connection point and the second contact layer can extend in lateral directions from the first further semiconductor chip to the molded body, at least in some areas, so that they cover the molded body on the underside thereof in some areas. It is possible in this case that the further electrical connection point and the second contact layer extend without interruption from a region in which they cover the first further semiconductor chip to a region in which they cover the molded body. In the region of the first further semiconductor chip, the further electrical connection point and the second contact layer are mechanically and electrically connected to the first further semiconductor chip; in the region of the molded body, the further electrical connection point and the second contact layer are mechanically connected to the molded body.

According to at least one embodiment of the optoelectronic semiconductor component, the second contact layer contains or consists of aluminum.

The second contact layer in this case can be in a similar or identical form to the first contact layer. The first and second contact layers can consist of the same material. In particular, the first and second contact layers can be produced together by the same method and in the same process steps.

According to at least one embodiment of the optoelectronic semiconductor component, the second contact layer is partly in direct contact with the first further semiconductor chip and/or the molded body. As a result of the direct contact of the second contact layer with the first further semiconductor chip and/or the molded body, the mechanical adhesion between the further electrical connection point and the remaining components of the optoelectronic semiconductor component is increased.

In particular, it is possible that the second contact layer is in direct contact both with the first further semiconductor chip and with the molded body, such that the second contact layer directly borders both components and extends in lateral directions from the first further semiconductor chip to the molded body. In this case, it is particularly advantageous if the molded body and the first further semiconductor chip are flush or substantially flush with one another on the underside of the first further semiconductor chip which faces towards the further electrical connection point.

A component of the first further semiconductor chip with which the second contact layer is in direct contact can contain e.g. silicon or germanium or can consist of one of these materials.

According to at least one embodiment of the optoelectronic semiconductor component, the first further semiconductor chip is in the form of a through-connection, which extends through the molded body in some areas. The through-connection is electrically-conductively connected to the optoelectronic semiconductor chip. In particular, the through-connection can be connected thereto on a side of the optoelectronic semiconductor chip facing away from the electrical connection point. If the electrical connection point is connected to the n-side of the optoelectronic semiconductor chip, the through-connection can be connected e.g. to the p-side of the optoelectronic semiconductor chip and vice versa. During operation of the optoelectronic semiconductor chip, this can be contacted on the n- and p-side through the electrical connection point and, by means of the through-connection, through the further electrical connection point.

According to at least one embodiment of the optoelectronic semiconductor component, the first further semiconductor chip is in the form of a protection diode and is connected in antiparallel with the optoelectronic semiconductor chip. Connection in antiparallel here means that an n-side of the first further semiconductor chip is connected to the p-side of the optoelectronic semiconductor chip and a p-side of the first further semiconductor chip is connected to the n-side of the optoelectronic semiconductor chip. In particular, the further electrical connection point can be connected to the n-side of the first further semiconductor chip if the electrical connection point is connected to the p-side of the optoelectronic semiconductor chip. Alternatively, the further electrical connection point can be connected to the p-side of the first further semiconductor chip if the electrical connection point is connected to the n-side of the optoelectronic semiconductor chip.

According to at least one embodiment of the optoelectronic semiconductor component, the optoelectronic semiconductor component comprises a second further semiconductor chip, wherein the molded body at least partly surrounds the second further semiconductor chip laterally, the electrical connection point at least partly covers the underside of the second further semiconductor chip and the first contact layer borders, e.g. directly borders, the underside of the second further semiconductor chip.

According to at least one embodiment of the optoelectronic semiconductor component, the first further semiconductor chip is in the form of a through-connection, which extends through the molded body in some areas, and the second further semiconductor chip is in the form of a protection diode and is connected in antiparallel with the optoelectronic semiconductor chip.

According to at least one embodiment of the optoelectronic semiconductor component, the electrical connection point comprises at least one barrier layer, which is arranged on a side of the first contact layer facing away from the optoelectronic semiconductor chip.

The barrier layer is formed using materials which are selected such that they react with the adjacent layers, i.e. for example the first contact layer, substantially only to form an adhesive bond and otherwise no chemical reaction takes place, particularly with the materials of the optoelectronic semiconductor chip. The barrier layer can consist of at least one of the following materials, or can contain at least one of the materials: titanium, tungsten, titanium-tungsten, titanium nitride, titanium-tungsten nitride, tungsten nitride.

The electrical connection point can comprise multiple barrier layers, which can be formed using the same or different materials. Between the barrier layers, further layers can be introduced, which are formed using another material that can prevent consistent defects in the stack of barrier layers, so that the stack of barrier layers is particularly impervious.

The at least one barrier layer here is selected such that it does not undergo, or barely undergoes, any chemical reactions with a connecting material by which the optoelectronic semiconductor component is affixed and electrically contacted at its intended location and inhibits or prevents diffusion of connecting material in the optoelectronic semiconductor chip.

According to at least one embodiment of the optoelectronic semiconductor component, the electrical connection point comprises a protective layer, which is arranged on a side of the at least one barrier layer facing away from the contact layer. The protective layer is a terminating layer, which terminates the electrical connection point externally on its side facing away from the optoelectronic semiconductor chip. In other words, the protective layer forms an external surface of the electrical connection point, at least in some areas. The protective layer thus acts as a connection layer having a connecting material, with which the optoelectronic semiconductor component is affixed and electrically connected at its intended location. In particular, the protective layer can act as an adhesive solder layer.

The protective layer can be selected in terms of its material such that it reacts with an adjacent layer of the electrical connection point, so that particularly good adhesion is obtained with this layer and it is stable with respect to degradation processes, facilitating storage of the optoelectronic semiconductor component before it is affixed at its intended location. For this purpose, for example, the protective layer can be formed using gold or can consist of gold. However, the reaction of the protective layer with an adjacent layer does not, in this case, result in material of the adjacent layer being able to diffuse through the protective layer. In particular, before the optoelectronic semiconductor component is affixed at its intended location, such a penetration of the protective layer by the material of adjacent layers does not occur, or occurs only to a negligible degree.

According to at least one embodiment of the optoelectronic semiconductor component, the protective layer is formed in such a way that the first contact layer is completely overmolded by the protective layer and is in particular laterally overmolded by the protective layer.

In corresponding embodiments of the optoelectronic semiconductor component, the further electrical connection point can also comprise a corresponding barrier layer, which is arranged on a side of the second contact layer facing away from the first further semiconductor chip.

In corresponding embodiments of the optoelectronic semiconductor component, the further electrical connection point can also comprise a corresponding protective layer, which is arranged on sides of the corresponding barrier layer facing away from the second contact layer.

According to at least one embodiment of the optoelectronic semiconductor component, the electrical connection point comprises a third contact layer, which is arranged on a side of the first contact layer facing away from the optoelectronic semiconductor chip. The third contact layer in this case is produced by means of electroless deposition and the first contact layer acts as a seed layer for the electroless deposition.

In particular in embodiments of the optoelectronic semiconductor component in which the electrical connection point does not comprise a barrier layer, the electrical connection point can comprise the third contact layer.

The third contact layer can lead e.g. to further increased mechanical stability of the optoelectronic semiconductor component. For this purpose, the third contact layer can be formed to be appropriately thick. In addition or alternatively, the third contact layer can also contribute to further improved electrical conductivity of the electrical connection point.

If the first contact layer is used as a seed layer for electroless deposition, the first contact layer can, for example, be patterned for this purpose before the electroless deposition. For example, a lithographic process followed by an etching process can be used for this purpose. Alternatively, the first contact layer can be patterned by means of a lift-off method.

An optoelectronic arrangement is further provided. The optoelectronic arrangement comprises at least one optoelectronic semiconductor component according to the improved concept. In other words, all features described for the optoelectronic semiconductor component are also described for the optoelectronic arrangement and vice versa. The optoelectronic arrangement further comprises a connection carrier, which is e.g. a printed circuit board. The at least one optoelectronic semiconductor component is mechanically affixed on and electrically connected to the at least one connection carrier, for which purpose a connecting material is arranged between the connection carrier and the optoelectronic semiconductor component, the connecting material being in direct contact with the electrical connection point and optionally the further electrical connection point. The connecting material is e.g. a solder material, such as for example a solder paste.

In addition, a method for producing an optoelectronic semiconductor component is provided.

According to at least one embodiment of the method, an electrically conductive carrier and an active part of an optoelectronic semiconductor chip are provided.

According to at least one embodiment of the method, the carrier is connected to the active part by means of a wafer bonding method.

According to at least one embodiment of the method, a first contact layer is applied on the underside of the carrier, wherein the first contact layer at least partly covers the underside of the carrier and the first contact layer contains or consists of aluminum.

According to at least one embodiment of the method, the application of the first contact layer comprises physical vapor deposition. In particular, the first contact layer can be applied exclusively by means of physical vapor deposition.

All methods of physical vapor deposition are suitable here, in particular thermal evaporation, electron beam vapor deposition, pulsed laser deposition, electric arc evaporation, sputtering, cathode sputtering and ion plating.

According to at least one embodiment of the method, the method comprises a process for oxide removal before the first contact layer is applied. Oxides on the underside of the carrier are removed here in order to achieve e.g. a hydrophobic surface. The oxide removal process can comprise e.g. a wet chemical process and/or a plasma cleaning process.

Further embodiments of the method can be taken directly and unambiguously from the various embodiments of the optoelectronic semiconductor component and vice versa. By means of the method, for example, an optoelectronic semiconductor component as described here can be produced. All features disclosed for the optoelectronic semiconductor component are therefore also disclosed for the method and vice versa.

The improved concept is described in more detail below with the aid of exemplary embodiments and associated figures. Identical components or components having the same effect may be indicated with the same reference characters and may be explained only in relation to the figure in which they first appear. Their description will not necessarily be repeated in the subsequent figures.

Shown are.

Figures 1, 2:
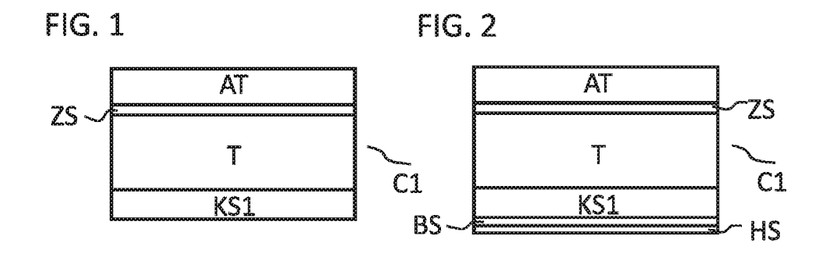
FIG. 1 shows a cross-section through an exemplary embodiment of an optoelectronic semiconductor component according to the improved concept.
FIG. 2 shows a cross-section through a further exemplary embodiment of an optoelectronic semiconductor component according to the improved concept.

FIG. 1 shows a cross-section through an optoelectronic semiconductor component according to the improved concept. The optoelectronic semiconductor component comprises an optoelectronic semiconductor chip C1 and an electrical connection point. In the example of FIG. 1, the optoelectronic semiconductor chip comprises a carrier T, which is electrically conductive. The carrier T here is formed using e.g. silicon or germanium. The carrier T has a thickness of e.g. at least 50 µm. The optoelectronic semiconductor chip C1 furthermore comprises an active part AT, which contains epitaxially grown layers. The active part AT here is arranged above the carrier T in a vertical direction.

The optoelectronic semiconductor chip C1 furthermore comprises an intermediate layer ZS, which is arranged between the carrier T and the active part AT. The intermediate layer ZS comprises for example a solder material, e.g. an alloy, a eutectic alloy, an alloy for isothermal solidification or a conductive adhesive. The carrier T and the active part AT are connected to one another e.g. by means of a wafer bonding method, e.g. by means of a eutectic or an adhesive wafer bonding method, through the intermediate layer ZS.

The electrical connection point in the example shown comprises a first contact layer KS1, which for example completely covers the underside of the carrier T. In alternative embodiments, the first contact layer KS1 only partly covers the underside of the carrier T. The first contact layer KS1 contains e.g. aluminum or is formed using aluminum. The first contact layer KS1 has e.g. a thickness of between 20 nm and 5 µm, e.g. between 100 nm and 200 nm, for example 200 nm or approximately 200 nm.

To form an optoelectronic arrangement according to the improved concept, the optoelectronic semiconductor component shown can be affixed e.g. on a connection carrier P (not shown in FIG. 1). The connection carrier P can be e.g. a printed circuit board. To mount the optoelectronic semiconductor component on the connection carrier P, e.g. connecting material, for example a solder paste, can connect the first contact layer KS1 to the connection carrier P.

In FIG. 2, a cross-section through a further exemplary embodiment of an optoelectronic semiconductor component according to the improved concept is shown, which is based on the exemplary embodiment of FIG. 1.

In addition to the exemplary embodiment shown in FIG. 1, the electrical connection point in the exemplary embodiment of FIG. 2 furthermore comprises a barrier layer BS, which is arranged on a side of the first contact layer KS1 facing away from the carrier T and borders this. Furthermore, the electrical connection point comprises a protective layer HS, which is arranged on a side of the barrier layer BS1 facing away from the first contact layer KS1 and borders this. The barrier layer here is formed e.g. using titanium, tungsten, titanium-tungsten, titanium nitride, titanium-tungsten nitride or tungsten nitride. The protective layer HS is formed, for example, using gold or consists of gold.

The protective layer HS here acts e.g. as an adhesive solder layer for connecting the optoelectronic semiconductor component to the connection carrier P (not shown in FIG. 2), e.g. by means of a solder paste.

In the example shown, the barrier layer BS completely covers the side of the first contact layer KS1 facing away from the carrier T. Furthermore, the protective layer HS completely covers the side of the barrier layer BS facing away from the first contact layer KS1.

In alternative embodiments, the protective layer HS, in contrast to the example shown in FIG. 2, also completely surrounds the barrier layer BS and the first contact layer KS1 laterally.

Figure 3:
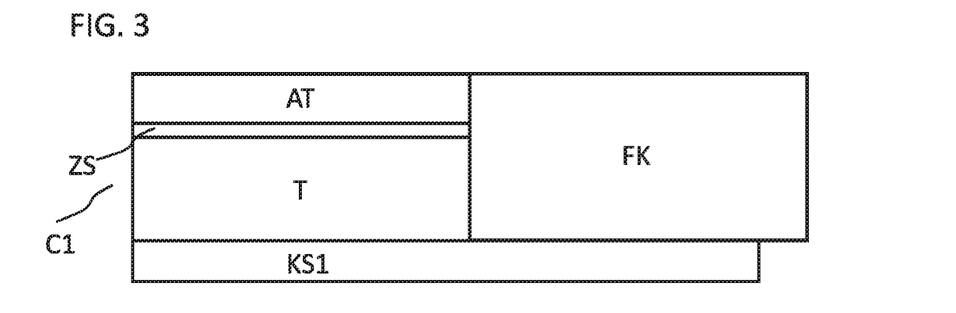
FIG. 3 shows a cross-section through a further exemplary embodiment of an optoelectronic semiconductor component according to the improved concept.

FIG. 3 shows a cross-section through a further exemplary embodiment of the optoelectronic semiconductor component according to the improved concept.

The optoelectronic semiconductor component shown comprises an optoelectronic semiconductor chip C1, as described in relation to FIGS. 1 and 2. Furthermore, the optoelectronic semiconductor component comprises a molded body FK, which comprises an electrically insulating material and which at least partly surrounds the optoelectronic semiconductor chip C1 laterally. In the example shown, the molded body FK surrounds the optoelectronic semiconductor chip C1 only on one side, namely the right-hand side. In alternative embodiments, however, the molded body FK can also surround the optoelectronic semiconductor chip C1 on the left-hand side; in particular, the molded body FK can also completely surround the optoelectronic semiconductor chip C1 laterally.

In the exemplary embodiment shown, the top side of the molded body FK and the top side of the optoelectronic semiconductor chip C1 are flush or substantially flush with one another. In addition, the underside of the molded body FK and the underside of the optoelectronic semiconductor chip C1 are flush or substantially flush with one another.

The optoelectronic semiconductor component additionally comprises an electrical connection point which, in the example shown, comprises a first contact layer KS1. In the example of FIG. 3, the first contact layer KS1 completely covers the underside of the carrier T and partly covers the underside of the molded body FK. In particular, the first contact layer KS1 extends without interruption from a region where it covers the carrier T into a region in which it partly covers the molded body FK. The first contact layer KS1 has e.g. a thickness of between 20 nm and 5 μm, e.g. between 100 nm and 200 nm, for example 200 nm.

In alternative embodiments, however, the first contact layer KS1 may also completely cover the molded body FK on the underside thereof and/or may only partly cover the carrier T.

As in the figures described above, the first contact layer KS1 in the example shown contains or consists of aluminum.

Through the use of aluminum in the first contact layer KS1, particularly good adhesion of the first contact layer KS1, both on the carrier T and on the molded body FK, is ensured. Furthermore, a particularly good electrical contact between the carrier T and the first contact layer KS1 is ensured.

As described in relation to FIG. 1, the first contact layer KS1 can be used for affixing the optoelectronic semiconductor component on a connection carrier P (not shown in FIG. 3), e.g. a printed circuit board, e.g. by means of a solder paste, and for electrically connecting it thereto.

Figure 4:
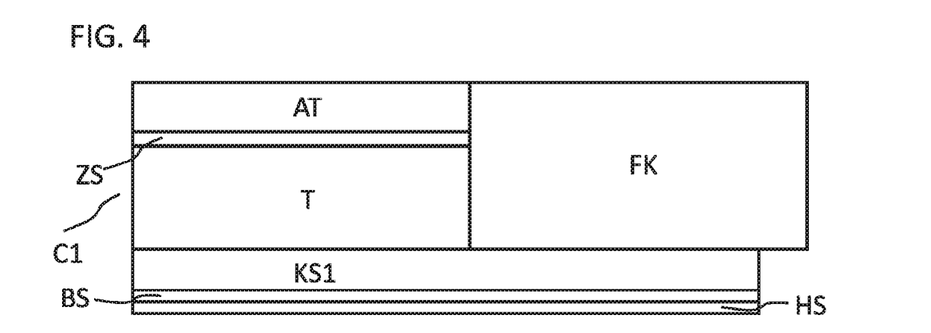
FIG. 4 shows a cross-section through a further exemplary embodiment of an optoelectronic semiconductor component according to the improved concept.

In FIG. 4, a cross-section through a further exemplary embodiment of the optoelectronic semiconductor component according to the improved concept is shown, which is based on the exemplary embodiment of FIG. 3.

In addition to the exemplary embodiment shown in FIG. 3, the electrical connection point comprises a barrier layer BS and a protective layer HS. In relation to the barrier layer BS and the protective layer HS, the statements made regarding the description of the exemplary embodiments from FIG. 2 apply mutatis mutandis.

Figure 5:
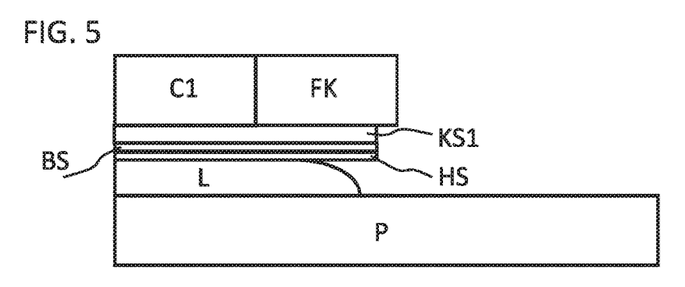
FIG. 5 shows a cross-section through an exemplary embodiment of an optoelectronic arrangement according to the improved concept.

In FIG. 5, a cross-section through an optoelectronic arrangement according to the improved concept is shown.

The optoelectronic arrangement comprises an optoelectronic semiconductor component, as shown in FIG. 4. For reasons of clarity, the active part AT, the intermediate layer ZS and the carrier T of the optoelectronic semiconductor chip C1 are not shown explicitly. Furthermore, the optoelectronic arrangement comprises a connection carrier P, which is formed e.g. by a printed circuit board. The optoelectronic semiconductor component is connected to the connection carrier P by means of a connecting material L. The connecting material L here can be e.g. a solder material, in particular a solder paste.

Figure 6:
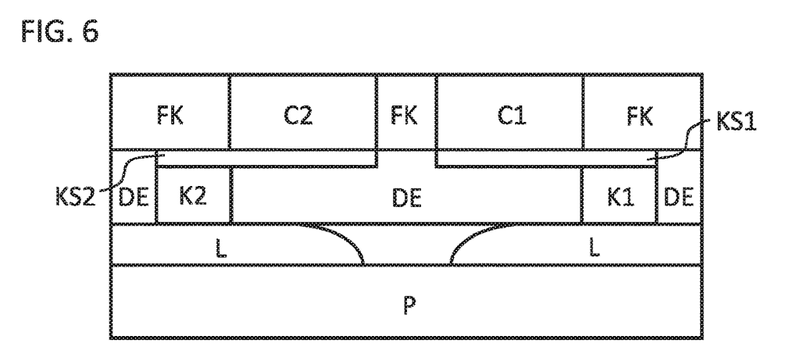
FIG. 6 shows a cross-section through a further exemplary embodiment of an optoelectronic arrangement according to the improved concept.

FIG. 6 shows a cross-section through a further embodiment of the optoelectronic arrangement according to the improved concept.

The optoelectronic semiconductor component comprises an optoelectronic semiconductor chip C1, which can be formed as described in relation to the preceding figures. Furthermore, the optoelectronic semiconductor component comprises a first further semiconductor chip C2, which is arranged at a distance laterally from the optoelectronic semiconductor chip C1; to the left in the example shown. The optoelectronic semiconductor component additionally comprises a molded body FK, which completely surrounds the optoelectronic semiconductor chip C1 and the first further semiconductor chip C2 laterally. In the example shown, the top side of the optoelectronic semiconductor chip C1, the top side of the molded body FK and the top side of the first further semiconductor chip C2 are flush or substantially flush with one another. Similarly, the underside of the optoelectronic semiconductor chip C1, the underside of the molded body FK and the underside of the first further semiconductor chip C2 are flush or substantially flush with one another.

The optoelectronic semiconductor component furthermore comprises an electrical connection point and a further electrical connection point. The electrical connection point in the example shown comprises a first contact layer KS1, while the further electrical connection point comprises a second contact layer KS2. The first contact layer KS1 is, as described in the preceding figures, arranged such that it completely covers the underside of the optoelectronic semiconductor chip C1 and partly covers the underside of the molded body FK. The first contact layer KS1 contains aluminum, for example, or is in the form of an aluminum layer.

Similarly, the second contact layer KS2 is arranged such that it directly borders the underside of the further semiconductor chip C2 and completely covers this. In alternative embodiments, the second contact layer KS2 may also only partly cover the underside of the further semiconductor chip C2. In addition, the second contact layer KS2 directly borders the underside of the molded body FK and partly covers this. The second contact layer KS2 here contains aluminum, for example, or is in the form of an aluminum layer. The first and second contact layers KS1, KS2 are produced and patterned in with the same process steps, for example. These process steps can comprise e.g. a PVD method of metallizing followed by a lithographic process and an etching process. Alternatively, the process steps can also comprise a lift-off method.

In the example shown, three parts of the molded body FK can be seen, which appear separate from one another because of the cross-sectional view. In an actual spatial arrangement, however, the molded body FK is formed e.g. continuously, so that the three parts of the molded body FK shown are in reality continuous, as shown e.g. in FIG. 7.

The optoelectronic semiconductor component additionally comprises a first contact K1, which borders a side of the first contact layer KS1 facing away from the optoelectronic semiconductor chip C1 and the molded body FK and partly covers this. The optoelectronic semiconductor component furthermore comprises a second contact K2, which borders a side of the second contact layer KS2 facing away from the further semiconductor chip C2 and the molded body FK and partly covers this. The first and second contacts K1, K2 here are conductive. For example, the first and/or second contact K1, K2 can be formed using a metal, an alloy or a semiconductor material, such as e.g. silicon.

Furthermore, the optoelectronic semiconductor component comprises a dielectric material DE, which borders the side of the first contact layer KS1 facing away from the optoelectronic semiconductor chip C1 and the molded body FK, the side of the second contact layer KS2 facing away from the first further semiconductor chip C2 and the molded body FK and the underside of the molded body FK and partly covers these. Furthermore, the dielectric material DE completely surrounds the first contact K1 and the second contact K2 laterally. The dielectric material DE is formed using an electrically insulating material.

In the example shown, the dielectric material DE also completely surrounds the first contact layer KS1 and the second contact layer KS2 laterally. The underside of the dielectric material DE is flush or substantially flush with the first contact K1 and the second contact K2 in the example shown. As described above for the molded body FK, three parts of the dielectric material DE are shown in FIG. 6. In an actual spatial arrangement of the optoelectronic semiconductor component, however, the three parts of the dielectric material DE are connected to one another, for example.

Besides the optoelectronic semiconductor component, the optoelectronic arrangement also comprises a connection carrier P, which can be in the form of a printed circuit board. Furthermore, the optoelectronic arrangement comprises a connecting material L, e.g. a solder paste. The connecting material L is used for the electrical contacting of the optoelectronic semiconductor component with the connection carrier P through the contacts K1 and K2. In addition, the optoelectronic semiconductor component is mechanically connected to the connection carrier P through the connecting materials L.

The first contact K1 here is arranged with a lateral displacement in relation to the optoelectronic semiconductor chip C1 and the second contact K2 is accordingly arranged with a lateral displacement in relation to the first further semiconductor chip C2. This permits an increased distance between contact surfaces of the connection carrier P, on which the connecting material L is arranged for the contacting of the optoelectronic semiconductor component. This can be advantageous particularly in terms of the most compact possible arrangement of the semiconductor chips C1, C2 within the optoelectronic semiconductor component.

As already mentioned, the optoelectronic semiconductor chip C1 can be in the form of e.g. a light-emitting diode. The further semiconductor chip C2 can be in the form of e.g. a through-connection, which extends completely through the molded body. To this end, the further semiconductor chip C2 is formed using e.g. a metal, an alloy, e.g. an aluminum-silicon alloy, or a semiconductor material, for example silicon or germanium. On the top side of the further semiconductor chip C2, this can be electrically connected e.g. to the top side of the optoelectronic semiconductor chip C1 through an upper contact layer OKS (not shown in FIG. 6, cf. for example FIG. 7). In this way, the optoelectronic semiconductor chip C1 can be effectively bonded through the connection carrier P without there having to be e.g. a direct electrical connection of the top side of the optoelectronic semiconductor chip C1 to the connection carrier P.

In the exemplary embodiment of FIG. 6, the first and second contact layers KS1, KS2 each have a thickness in a vertical direction of e.g. between 20 nm and 5 μm. The thickness is preferably greater than 450 nm, e.g. equal to 500 nm or greater than 500 nm. Through the use of these relatively thick aluminum layers or aluminum-containing layers to form the contact layers KS1, KS2, e.g. an increased lateral electrical conductivity of the contact layers KS1, KS2 is achieved. This proves particularly advantageous for the electrical contacting of the optoelectronic semiconductor chip C1 and the first further semiconductor chip C2 through the contacts K1, K2 and the contact layers KS1, KS2. Particularly because of the laterally displaced arrangement of the contacts K1, K2 in relation to the optoelectronic semiconductor chip C1 and the first further semiconductor chip C2 respectively, such an increased lateral conductivity of the contact layers KS1, KS2 is advantageous or necessary.

It is pointed out that, for reasons of clarity, e.g. only part of the optoelectronic semiconductor component or the optoelectronic arrangement may be depicted in FIGS. 3 to 6. In FIGS. 3 to 5 in particular, the optoelectronic semiconductor component or the optoelectronic arrangement can also extend further to the left of the optoelectronic semiconductor chip C1. For example, the molded body FK can also border the optoelectronic semiconductor chip C1 on the left-hand side. The same applies mutatis mutandis to the optoelectronic arrangement from FIG. 6.

Figure 7:
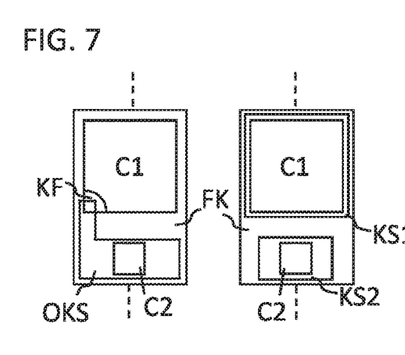
FIG. 7 shows a further exemplary embodiment of an optoelectronic semiconductor component according to the improved concept.

In FIG. 7, a further embodiment of the optoelectronic semiconductor component according to the improved concept is shown. In the left-hand part of FIG. 7, a top view of the optoelectronic semiconductor component is shown and in the right-hand part of FIG. 7, a view of the underside of the optoelectronic semiconductor component is shown.

The optoelectronic semiconductor component comprises an optoelectronic semiconductor chip C1 with a contact surface KF on the top side of the optoelectronic semiconductor chip C1, a first further semiconductor chip C2, which is arranged with a lateral displacement in relation to the optoelectronic semiconductor chip C1, and a molded body FK, which completely surrounds the optoelectronic semiconductor chip C1 and the first further semiconductor chip C2 laterally. The optoelectronic semiconductor chip C1, the first further semiconductor chip C2 and/or the molded body FK can, for example, be in the form as described in relation to the embodiments from FIGS. 1 to 6. In particular, the first further semiconductor chip C2 can be in the form of a through-connection, as described in relation to FIG. 6.

The optoelectronic semiconductor component furthermore comprises an electrical connection point with a first contact layer KS1 which, for example, completely covers the underside of the optoelectronic semiconductor chip C1 and a further electrical connection point with a second contact layer KS2, which, for example, completely covers the underside of the first further semiconductor chip C2. In addition, the optoelectronic semiconductor component comprises an upper contact layer OKS which, for example, completely covers the top side of the first further semiconductor chip C2 and, for example, partly covers the contact surface KF.

The optoelectronic semiconductor component from FIG. 7 can have a cross-section e.g. as shown in FIG. 6. In particular, the cross-section from FIG. 6 can correspond to a cross-section along the dashed lines shown in FIG. 7. A dielectric material DE and contacts K1, K2, which may optionally be comprised by the optoelectronic semiconductor component, are not shown in FIG. 7 for reasons of clarity.

The first and second contact layers KS1, KS2 are used e.g. for the electrical and/or mechanical contacting of the semiconductor chips C1, C2 to a connection carrier P, as shown in FIG. 6 (connection carrier P not shown in FIG. 7). The upper contact layer OKS is used e.g. for the electrical contacting of the optoelectronic semiconductor chip C1 with the first further semiconductor chip C2.

Figure 8:
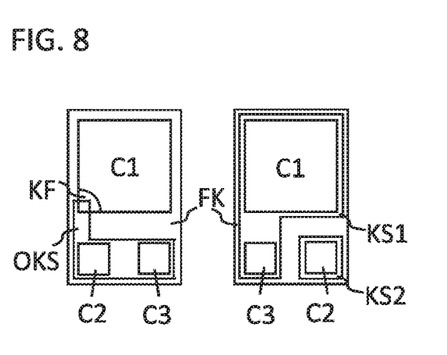
FIG. 8 shows a further exemplary embodiment of an optoelectronic semiconductor component according to the improved concept.

In FIG. 8, a further embodiment of the optoelectronic semiconductor component according to the improved concept is shown, which is based on the embodiment shown in FIG. 7. In the left-hand part of FIG. 8, a top view of the optoelectronic semiconductor component is shown and in the right-hand part of FIG. 8, a view of the underside of the optoelectronic semiconductor component is shown.

In addition to the embodiment shown in FIG. 7, the optoelectronic semiconductor component from FIG. 8 comprises a second further semiconductor chip C3, which is arranged with a lateral displacement in relation to the optoelectronic semiconductor chip C1 and the first further semiconductor chip C2. The molded body FK for example completely surrounds the second further semiconductor chip C3 laterally. The first contact layer KS1 for example completely covers the underside of the second further semiconductor chip C3. The upper contact layer OKS for example completely covers the top side of the second further semiconductor chip C3.

The first further semiconductor chip C2 is in the form of e.g. a through-connection, as described in FIG. 6. The second further semiconductor chip C3 is in the form of e.g. a protection diode. By means of the first contact layer KS1, e.g. an n-side of the optoelectronic semiconductor chip C1 and a p-side of the second further semiconductor chip C3 are electrically connected to one another. Accordingly, by means of the upper contact layer OKS, a p-side of the optoelectronic semiconductor chip C1 and an n-side of the second further semiconductor chip C3 can then be electrically connected to one another.

Alternatively, the p-side of the optoelectronic semiconductor chip C1 and the n-side of the second further semiconductor chip C3 can also be electrically connected to one another by means of the first contact layer KS1. Accordingly, the n-side of the optoelectronic semiconductor chip C1 and the p-side of the second further semiconductor chip C3 can then be electrically connected to one another by means of the upper contact layer OKS.

Both variants lead to an antiparallel connection of the optoelectronic semiconductor chip C1 and the second further semiconductor chip C3.

It is pointed out that the measurements, dimensions and distances of the parts of the optoelectronic semiconductor component or the optoelectronic arrangement shown in FIGS. 1 to 8 are not necessarily depicted to scale. In particular, these measurements, dimensions and distances can also be represented differently [in] different figures, for example.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The priority of the German patent application DE 102015108056.7 is claimed, the disclosure content of which is hereby incorporated by reference.

REFERENCE NUMERALS

C1 Optoelectronic semiconductor chip
AT Active part
T Carrier
ZS Intermediate layer
KS1, KS2 Contact layers
BS Barrier layer
HS Protective layer
FK Molded body
L Connecting material
P Connection carrier
C2, C3 Further semiconductor chips
K1, K2 Contacts
DE Dielectric material
KF Contact surface
OKS Upper contact layer

The invention claimed is:

1. An optoelectronic semiconductor component comprising:
    an optoelectronic semiconductor chip comprising
        an electrically conductive carrier,
        an active part, which contains epitaxially grown layers, and
        an intermediate layer, which is arranged between the carrier and the active part and contains a solder material;
    an electrical connection point, which at least partly covers an underside of the carrier,
    wherein the electrical connection point comprises a first contact layer on a side facing towards the carrier, and
    wherein the first contact layer contains or consists of aluminum; and
    a molded body, which comprises an electrically insulating material and which at least partly surrounds the optoelectronic semiconductor chip laterally,
    wherein the electrical connection point at least partly, and in particular completely, covers an underside of the molded body, and
    wherein the first contact layer borders the underside of the molded body.

2. The optoelectronic semiconductor component according to claim 1, wherein the carrier contains silicon or germanium or consists of silicon or germanium.

3. The optoelectronic semiconductor component according to claim 1, wherein the carrier has a thickness of at least 50 µm.

4. The optoelectronic semiconductor component according to claim 1, wherein the first contact layer has a thickness of between 20 nm and 5 µm.

5. The optoelectronic semiconductor component according to claim 1, wherein the first contact layer has a thickness in a range of 100 nm to 200 nm.

6. The optoelectronic semiconductor component according to claim 1, wherein the first contact layer has a thickness of at least 450 nm.

7. The optoelectronic semiconductor component according to claim 1, wherein the first contact layer contains silicon.

8. The optoelectronic semiconductor component according to claim 1, further comprising:
    a first further semiconductor chip, wherein the molded body at least partly surrounds the first further semiconductor chip laterally; and
    a further electrical connection point, which at least partly covers the underside of the first further semiconductor chip and at least partly covers the underside of the molded body,
    wherein the further electrical connection point comprises a second contact layer on a side facing towards the first further semiconductor chip and the molded body, and
    wherein the second contact layer contains aluminum or consists of aluminum.

9. The optoelectronic semiconductor component according to claim 8, wherein the first further semiconductor chip is in the form of a through-connection, which extends through the molded body in some areas.

10. The optoelectronic semiconductor component according to claim 8, wherein the first further semiconductor chip is in the form of a protection diode and is connected in antiparallel with the optoelectronic semiconductor chip.

11. The optoelectronic semiconductor component according to claim 8, further comprising:

a second further semiconductor chip,
wherein the molded body at least partly surrounds the second further semiconductor chip laterally,
wherein the electrical connection point at least partly covers the underside of the second further semiconductor chip, and
wherein the first contact layer borders an underside of the second further semiconductor chip.

12. The optoelectronic semiconductor component according to claim 11, wherein the first further semiconductor chip is in the form of a through-connection, which extends through the molded body in some areas, and
wherein the second further semiconductor chip is in the form of a protection diode and is connected in antiparallel with the optoelectronic semiconductor chip.

13. The optoelectronic semiconductor component according to claim 1, wherein the electrical connection point comprises at least one barrier layer, which is arranged on a side of the first contact layer facing away from the optoelectronic semiconductor chip, and
wherein the electrical connection point comprises a protective layer, which is arranged on a side of the at least one barrier layer facing away from the first contact layer.

14. The optoelectronic semiconductor component according to claim 1, wherein the electrical connection point comprises a third contact layer, which is arranged on a side of the first contact layer facing away from the optoelectronic semiconductor chip,
wherein the third contact layer is produced by means of electroless deposition, and
wherein the first contact layer acts as a seed layer for the electroless deposition.

15. An optoelectronic arrangement comprising:
a connection carrier; and
at least one optoelectronic semiconductor component according to claim 1,
wherein between the connection carrier and the optoelectronic semiconductor component a connecting material is arranged, and
wherein the connecting material is in direct contact with the electrical connection point.

16. A method for producing an optoelectronic component comprising:
providing an electrically conductive carrier and an active part of an optoelectronic semiconductor chip;
connecting the carrier to the active part by means of a wafer bonding method;
applying a molded body which comprises an electrically insulating material around the optoelectronic semiconductor chip; and
applying a first contact layer on an underside of the carrier and an underside of the molded body,
wherein the first contact layer at least partly covers the underside of the carrier and the underside of the molded body,
wherein the first contact layer contains aluminum or consists of aluminum, and
wherein the first contact layer borders the underside of the molded body.

17. The method according to claim 16, wherein the application of the first contact layer comprises physical vapor deposition.

* * * * *